US007498191B2

(12) United States Patent
Sung

(10) Patent No.: US 7,498,191 B2
(45) Date of Patent: Mar. 3, 2009

(54) SEMICONDUCTOR-ON-DIAMOND DEVICES AND ASSOCIATED METHODS

(76) Inventor: Chien-Min Sung, 64 Chung-San Road, Taipei County (TW) 23911

( * ) Notice: Subject to any disclaimer, the term of this patent is extended or adjusted under 35 U.S.C. 154(b) by 204 days.

(21) Appl. No.: 11/440,793

(22) Filed: May 22, 2006

(65) Prior Publication Data
US 2007/0269964 A1 Nov. 22, 2007

(51) Int. Cl.
*H01L 21/00* (2006.01)
(52) U.S. Cl. ........................ 438/105; 438/198; 438/458; 257/E21.603; 257/E21.604
(58) Field of Classification Search ................ 438/105, 438/150, 187, 198, 496; 257/E21.005, E21.041, 257/E21.049, E21.096, E21.105, E21.107, 257/E21.182, E21.323, E21.344, E21.603, 257/E21.604
See application file for complete search history.

(56) References Cited
U.S. PATENT DOCUMENTS

| 5,373,171 | A * | 12/1994 | Imai et al. ................ 257/77 |
| 6,497,763 | B2 | 12/2002 | Kub et al. |
| 6,794,276 | B2 | 9/2004 | Letertre et al. |
| 6,818,531 | B1 | 11/2004 | Yoo et al. |
| 2002/0182839 | A1 * | 12/2002 | Ogawa et al. ............... 438/604 |
| 2003/0203604 | A1 | 10/2003 | Makita |
| 2004/0119067 | A1 * | 6/2004 | Weeks et al. ................ 257/40 |
| 2004/0248377 | A1 * | 12/2004 | Yoo et al. ................... 438/458 |
| 2004/0256624 | A1 * | 12/2004 | Sung .......................... 257/77 |
| 2006/0046325 | A1 | 3/2006 | Usui et al. |
| 2007/0066194 | A1 | 3/2007 | Wielonski et al. |

FOREIGN PATENT DOCUMENTS
WO WO 2004/008486 1/2004

OTHER PUBLICATIONS
Witthaut, M. et al., Characterization of ternary Al-B-N films, 2000, pp. 478-483, Elsevier Science B.V., www.elsevier.com/locate/tsf.

* cited by examiner

*Primary Examiner*—Walter L Lindsay, Jr.
*Assistant Examiner*—Cheung Lee
(74) *Attorney, Agent, or Firm*—Thorpe North & Western LLP

(57) ABSTRACT

Semiconductor-on-diamond (SOD) substrates and methods for making such substrates are provided. In one aspect, a method of making an SOD substrate may include depositing a base layer onto a lattice-orienting silicon (Si) substrate such that the base layer lattice is substantially oriented by the Si substrate, depositing a semiconductor layer onto the base layer such that the semiconductor layer lattice is substantially oriented with respect to the base layer lattice, and disposing a layer of diamond onto the semiconductor layer. The base layer may include numerous materials, including, without limitation, aluminum phosphide (AlP), boron arsenide (BAs), gallium nitride (GaN), indium nitride (InN), and combinations thereof. Additionally, the method may further include removing the lattice-orienting Si substrate and the base layer from the semiconductor layer. In one aspect, the Si substrate may be of a single crystal orientation.

20 Claims, 2 Drawing Sheets

SEMICONDUCTOR-ON-DIAMOND DEVICES AND ASSOCIATED METHODS

FIELD OF THE INVENTION

The present invention relates generally to methods of making substrates having a semiconductor layer disposed on a diamond substrate, as well as associated devices. Accordingly, the present invention involves the chemical and material science fields.

BACKGROUND OF THE INVENTION

As computers and other electronic devices become smaller and faster, the demands placed on semiconductor devices utilized therein increase geometrically. Ultra-large-scale integration (ULSI) is a technology that places at least 1million circuit elements on a single semiconductor chip. In addition to the tremendous density issues that already exist, with the current movement toward size reduction, ULSI is becoming even more delicate, both in size and materials than ever before. As current technology moves beyond ULSI, several barriers emerge that may be insurmountable with current wafer and substrate materials.

One barrier arises due to the accumulation of heat that may not be effectively channeled out of the crystal lattice of Group IV semiconductors. Semiconductors tend to have thermal conductivities that are a fraction of copper metal. Hence, semiconductor devices are often cooled with copper heat spreaders. However, as the power requirements future generations of semiconductor devices increase, copper heat spreaders will become reservoirs for heat accumulation.

Another barrier arises due to the accumulation of charge carriers, i.e. electrons and holes, which are intrinsic to quantum fluctuation. Accumulation of the carriers creates noise, and tends to obscure electrical signals within the semiconductor device. This problem is compounded as the temperature of the device increases. Much of the carrier accumulation may be due to the intrinsically low bonding energy and the directional anisotropy of typical semiconductor crystal lattices.

Yet another barrier may be a further result of current semiconductor materials. These semiconductors tend to have a high leaking current and a low break down voltage. As the size of semiconductor transistors and other circuit elements decrease, coupled with the growing need to increase power and frequency, current leak and break down voltage also become critical.

As power and frequency requirements increase and the size of semiconductor components decreases, the search for materials to alleviate these problems becomes crucial to the progress of the semiconductor industry. One material that may be suitable for the next generation of semiconductor devices is diamond. The physical properties of diamond, such as its high thermal conductivity, low intrinsic carrier concentration, and high band gap make it a desirable material for use in many high-powered electronic devices.

The semiconductor industry has recently expanded efforts in producing semiconductor-on-insulator (SOI) devices. These devices allow for electrical insulation between an underlying substrate and any number of useful semiconductor devices. Typically, these SOI devices utilize insulating layers with poor thermal conductivity, high degree of thermal expansion mismatch, and/or difficulties in epitaxial growth of silicon or other semiconductor materials. In light of some of these difficulties, various efforts have explored using diamond as the insulating layer with some success. However, such devices continue to benefit from further improvement such as decreasing manufacturing costs, improving performance, and the like.

SUMMARY OF THE INVENTION

Accordingly the present invention provides semiconductor-on-diamond (SOD) substrates and methods for making such substrates. In one aspect, a method of making an SOD substrate is provided. Such a method may include depositing a base layer onto a lattice-orienting silicon (Si) substrate such that the base layer lattice is substantially oriented by the Si substrate. The base layer may include numerous materials, including, without limitation, aluminum phosphide (AlP), boron arsenide (BAs), gallium nitride (GaN), indium nitride (InN), and combinations thereof. The method may further include depositing a semiconductor layer onto the base layer such that the semiconductor layer lattice is substantially oriented with respect to the base layer lattice, and disposing a layer of diamond onto the semiconductor layer. The method may further include removing the lattice-orienting Si substrate and the base layer from the semiconductor layer. In one aspect, the Si substrate may be of a single crystal orientation.

Various semiconductor layers may be deposited onto the base layer, depending on the intended utility of the SOD substrate. For example, in one aspect the semiconductor layer may be a layer of gallium nitride (GaN) and the base layer may be InN. The GaN may be deposited on the InN layer by any means known to one of ordinary skill in the art. In one specific aspect, however, the GaN layer may be deposited onto the layer of InN by gradually transitioning the layer of InN into the layer of GaN. For example, gradually transitioning the layer of InN into the layer of GaN may include fixing the concentration of N being deposited and varying the deposited concentration of Ga and of In such that a ratio of Ga:In gradually transitions from about 0:1 to about 1:0.

In another aspect, the semiconductor layer may be a layer of AlN and the base layer may be InN. The AlN layer may be deposited onto the InN layer by any means known to one of ordinary skill in the art. In one specific aspect, however, the AlN may be deposited onto the layer of InN by gradually transitioning the layer of InN into the layer of AlN. In one aspect, for example, gradually transitioning the layer of InN into the layer of AlN may include fixing the concentration of N being deposited and varying the deposited concentration of In and of Al such that a ratio of In:Al gradually transitions from about 0:1 to about 1:0.

In yet another aspect, the semiconductor layer may include both GaN and AlN and the base layer may be InN. As has been described, the deposition of GaN and AlN may be by any means known to one of ordinary skill in the art. As such, in one aspect depositing the semiconductor layer may further include depositing a layer of GaN onto the layer of InN such that the GaN layer lattice is substantially oriented with respect to the InN layer lattice, and depositing a layer of AlN onto the layer of GaN such that the AlN layer lattice is substantially oriented with respect to the GaN layer lattice. Though various methods of substantially orienting a lattice with respect to another are contemplated, one method may be by gradual transition from one layer to another. For example, depositing the AlN and GaN layers onto the InN layer may include gradually transitioning the layer of InN into the layer of GaN and subsequently gradually transitioning the layer of GaN into the layer of AlN. Gradually transitioning the layer of GaN into the layer of AlN may further include fixing the concentration of N being deposited and varying the deposited concentration of Ga and of Al such that a ratio of Ga:Al gradually transitions from about 0:1 to about 1:0. The method may further include removing the GaN layer from the AlN layer. Additionally, any of the semiconductor layers formed according to aspects of the present invention may have a single crystal orientation as a result of formation by the deposition methods disclosed herein.

Various steps can further be taken to improve the lattice matching between the Si substrate and the base layer. For example, in one aspect a layer of SiC may be deposited onto the lattice-orienting Si substrate such that the SiC layer lattice is substantially oriented by the Si substrate and the base layer may be deposited onto SiC layer such that the base layer lattice is substantially oriented with respect to the SiC layer lattice.

The lattice of the semiconductor layer may be formed in various orientations by depositing the base layer onto a specific face of the Si substrate. For example, in one aspect the base layer may be deposited onto a (100) face of the lattice-orienting Si substrate such that the base layer is deposited as a cubic base layer. Subsequent deposition of the semiconductor layer onto the cubic base layer may form a predominantly cubic semiconductor layer due to the orientation of the base layer. For example, if the base layer is InN, then cubic InN may be deposited on the Si substrate. Subsequent deposition of the semiconductor layers may result in a cubic semiconductor layer such as cubic GaN.

Numerous methods of disposing a layer of diamond onto the semiconductor layer are contemplated. In one aspect, the layer of diamond may be formed on the semiconductor layer. In another aspect, the layer of diamond may be bonded to the semiconductor layer. In such cases, the diamond layer may be formed separately from the semiconductor layer and subsequently bonded thereto. Furthermore, the diamond layer may be coupled to a support substrate.

Aspects of the present invention may also include SOD devices. For example, in one aspect an SOD device may include a layer of diamond and a single crystal semiconductor layer disposed onto to the diamond layer, where the single crystal semiconductor layer may include AlN, GaN, and combinations thereof. The single crystal semiconductor layer may also include cubic forms of the semiconductor, including cubic AlN, cubic GaN, and combinations thereof.

Numerous devices are contemplated that may include the SOD devices according to aspects of the present invention. For example, in one aspect the SOD device may be an LED. In another aspect, the SOD device may be an acoustic filter such as a SAW filter. In yet another aspect, the SOD device may be a semiconductor substrate.

DETAILED DESCRIPTION

Figure 1:
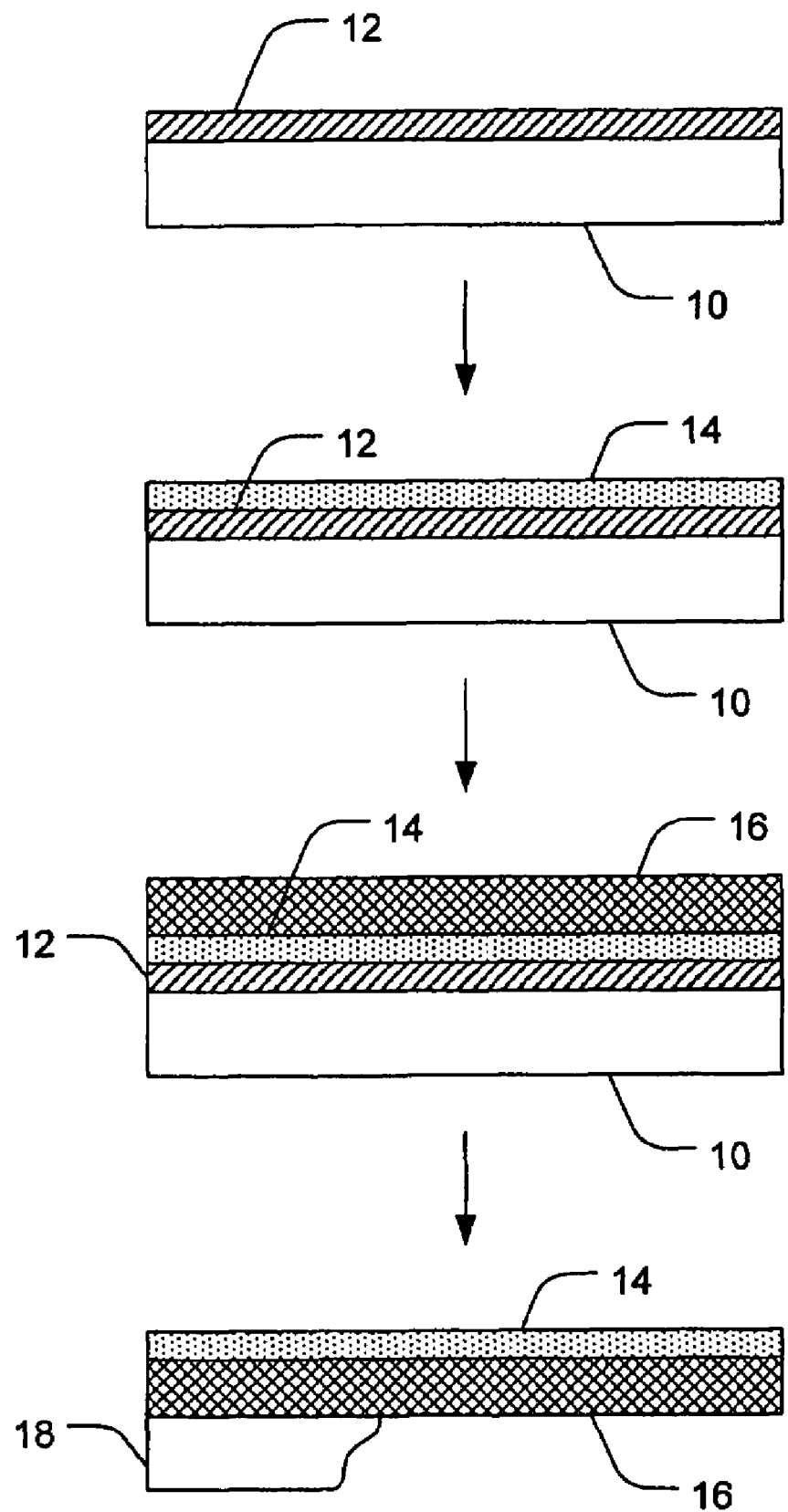
FIG. 1 is a sequential depiction of a method of making an SOD device in accordance with one embodiment of the present invention.

Before the present invention is disclosed and described, it is to be understood that this invention is not limited to the particular structures, process steps, or materials disclosed herein, but is extended to equivalents thereof as would be recognized by those ordinarily skilled in the relevant arts. It should also be understood that terminology employed herein is used for the purpose of describing particular embodiments only and is not intended to be limiting.

It must be noted that, as used in this specification and the appended claims, the singular forms "a," and, "the" include plural referents unless the context clearly dictates otherwise. Thus, for example, reference to "an intermediate layer" includes one or more of such layers, reference to "a carbon source" includes reference to one or more of such carbon sources, and reference to "a CVD technique" includes reference to one or more of such CVD techniques.

Definitions

In describing and claiming the present invention, the following terminology will be used in accordance with the definitions set forth below.

As used herein, "substrate" refers to a support surface to which various materials can be joined in forming a silicon-on-diamond (SOD) device. The substrate may be any shape, thickness, or material, required in order to achieve a specific result, and includes but is not limited to metals, alloys, ceramics, and mixtures thereof. Further, in some aspects, the substrate may be an existing semiconductor device or wafer, or may be a material which is capable of being joined to a suitable device.

As used herein, "nucleation enhancer" refers to a material, which increases the quality of a diamond layer formed from a plurality of diamond nuclei using a CVD process. In one aspect, the nucleation enhancer may increase the quality of a diamond layer by reducing movement or immobilizing diamond nuclei. Examples of nucleation enhancers include without limitation, metals, and various metallic compounds, as well as carbides and carbide forming materials.

As used herein with respect to a nucleation enhancer layer and an intermediate layer, "thin" refers to the thickness or depth of the layer being sufficiently small so as to not substantially interfere with the transfer of the intended configuration from the interface surface configuration to the device surface. In one aspect, the thickness of the nucleation enhancer may be less than about 0.1 micrometers. In another aspect, the thickness may be less than 10 nanometers. In another aspect, the thickness may be less than about 5 nanometers.

As used herein, "working surface" refers to the surface of a diamond layer which contacts a semiconductor, an intermediate layer, a wurtzitic boron nitride layer, or other electronic device.

As used herein, "diamond layer" refers to any structure, regardless of shape, which contains diamond-containing materials which can be incorporated into a SOD device. Thus, for example, a diamond film partially or entirely covering a surface is included within the meaning of these terms. Additionally, a layer of a material, such as metals, acrylics, or composites, having diamond particles disbursed therein is included in these terms.

As used herein, "grain boundaries" are boundaries in a crystalline lattice formed where adjacent seed crystals have grown together. An example includes polycrystalline diamond, where numerous seed crystals having grains of different orientations have grown together to form a heteroepitaxial layer.

As used herein, "crystal dislocations" or "dislocations" can be used interchangeably, and refer to any variation from essentially perfect order and/or symmetry in a crystalline lattice.

As used herein, "single crystal" refers to a crystalline material having a crystal lattice that is substantially free of crystal dislocations and/or grain boundaries.

As used herein, "vapor deposited" refers to materials which are formed using vapor deposition techniques. "Vapor deposition" refers to a process of depositing materials on a substrate through the vapor phase. Vapor deposition processes can include any process such as, but not limited to, chemical vapor deposition (CVD) and physical vapor deposition (PVD). A wide variety of variations of each vapor deposition method can be performed by those skilled in the art. Examples of vapor deposition methods include hot filament CVD, rf-CVD, laser CVD (LCVD), laser ablation, conformal diamond coating processes, metal-organic CVD (MOCVD), sputtering, thermal evaporation PVD, ionized metal PVD (IMPVD), electron beam PVD (EBPVD), reactive PVD, and the like.

As used herein, "chemical vapor deposition," or "CVD" refers to any method of chemically depositing diamond or other particles in a vapor form upon a surface. Various CVD techniques are well known in the art.

Methods for incorporating diamond or diamond-like materials into an SOD device can include known processes such as chemical vapor deposition (CVD) and physical vapor deposition (PVD). Various CVD techniques have been used in connection with depositing diamond or diamond-like materials onto a substrate. Typical CVD techniques use gas reactants to deposit the diamond or diamond-like material in a layer, or film. These gases generally include a small amount (i.e. less than about 5%) of a carbonaceous material, such as methane, diluted in hydrogen. A variety of specific CVD processes, including equipment and conditions, are well known to those skilled in the art.

As used herein, the term "substantially" refers to the complete or nearly complete extent or degree of an action, characteristic, property, state, structure, item, or result. For example, an object that is "substantially" enclosed would mean that the object is either completely enclosed or nearly completely enclosed. The exact allowable degree of deviation from absolute completeness may in some cases depend on the specific context. However, generally speaking the nearness of completion will be so as to have the same overall result as if absolute and total completion were obtained. The use of "substantially" is equally applicable when used in a negative connotation to refer to the complete or near complete lack of an action, characteristic, property, state, structure, item, or result. For example, a composition that is "substantially free of" particles would either completely lack particles, or so nearly completely lack particles that the effect would be the same as if it completely lacked particles. In other words, a composition that is "substantially free of" an ingredient or element may still actually contain such item as long as there is no measurable effect thereof.

As used herein, the term "about" is used to provide flexibility to a numerical range endpoint by providing that a given value may be "a little above" or "a little below" the endpoint.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary.

Concentrations, amounts, and other numerical data may be expressed or presented herein in a range format. It is to be understood that such a range format is used merely for convenience and brevity and thus should be interpreted flexibly to include not only the numerical values explicitly recited as the limits of the range, but also to include all the individual numerical values or sub-ranges encompassed within that range as if each numerical value and sub-range is explicitly recited. As an illustration, a numerical range of "about 1 to about 5" should be interpreted to include not only the explicitly recited values of about 1 to about 5, but also include individual values and sub-ranges within the indicated range. Thus, included in this numerical range are individual values such as 2, 3, and 4 and sub-ranges such as from 1-3, from 2-4, and from 3-5, etc., as well as 1, 2, 3, 4, and 5, individually.

This same principle applies to ranges reciting only one numerical value as a minimum or a maximum. Furthermore, such an interpretation should apply regardless of the breadth of the range or the characteristics being described.

The Invention

The present invention provides methods for making substantially single crystal semiconductor layers disposed on diamond substrates, and devices incorporating the same. The consecutive deposition of semiconductor layers having substantially different lattice sizes generally creates a lattice mismatch between the resulting layers. Significant lattice mismatch will cause high interface stress and high dislocation density in the resulting semiconductor device. The inventor has discovered that layers of materials deposited in particular orders can be used to generate increased levels of lattice matching, resulting in the formation of substantially single crystal semiconductor layers with very low interface stress and very low dislocation densities. This invention additionally entertains the use of a gradational composition that transitions between semiconductor lattices of different sizes in order to construct various single crystal semiconductor layers. Various methods of creating a gradational composition can be utilized in the present invention, including the amorphous mixing of atoms and the replacement of atoms in a fixed crystal lattice. A discussion of amorphous mixing to create a gradational composition can be found in Applicant's copending U.S. patent application Ser. No. 10/837,242 filed on Apr. 30, 2004, which is hereby incorporated by reference.

For example, in one aspect of the present invention a method of making a semiconductor-on-diamond (SOD) substrate is provided that includes depositing a base layer onto a lattice-orienting Si substrate such that the base layer lattice is substantially oriented by the Si substrate, depositing a semiconductor layer onto the base layer such that the semiconductor layer lattice is substantially oriented with respect to the base layer lattice, and disposing a layer of diamond onto the semiconductor layer. The lattice-orienting Si substrate and the base layer may be removed from the semiconductor layer to provide a single crystal semiconductor layer deposited on a diamond layer.

Various materials are contemplated that may be included in the base layer, and as such, the base layer should not be limited to the exemplary materials described herein. In one aspect, for example, the base layer materials may be selected to approximate or otherwise correspond to the interatomic distances of the Si substrate. Examples of such materials may include, without limitation, AlP, BAs, GaN, InN, and combinations thereof. In one specific aspect, the base layer may include AlP. In another specific aspect, the base layer may include BAs. In yet another specific aspect, the base layer may include GaN. In a further specific aspect, the base layer may include InN. It should be noted that much of the following discussion describes InN as the base layer material, and that this description is merely for convenience in describing aspects of the present invention. As such, no limitation is thereby intended.

By minimizing the lattice mismatch between layers, the single crystal nature of the Si substrate can be carried thought the various layers of the SOD device to form a single crystal semiconductor layer thereon. An ideal lattice match between layers will have a similar crystal structure and a similar atomic size with the diamond layer. Such similarities will thus improve the lattice matching, i.e. the one-to-one correspondence of atoms, across the boundary between the different materials. The higher the degree of lattice matching, the lower the likelihood that crystal dislocations and other defects will be propagated across the diamond-buffer layer boundary. Thus the degree of lattice matching will affect the performance and reliability of the SOD device. In addition, lattice matching also reduces stress across the boundary due to differential thermal expansion of the layers.

Various procedural steps may be taken to increase the likelihood of forming single crystal layers. For example, by selecting materials of adjoining layers that have a lattice mismatch (see Table 1) that is less than about 5%, the likelihood of grain boundaries and lattice dislocations is significantly decreased. It may be beneficial to keep the lattice mismatch below about 5% in order to minimize the dislocation density in an epitaxial layer. For those adjoining layers having a lattice mismatch greater than about 5%, compositional grading between layers may also decrease the likelihood of grain boundaries and lattice dislocations forming between the layers. Accordingly, during the deposition, if at least half of the compositional elements in the lattice can be kept the same, the composition can be graded by the compositional change as discussed herein. Compositional grading may be accomplished by any means known and as described herein.

TABLE 1

Lattice Mismatch Between Elements

|  | CC | BN | SiC | AlN | GaN | InN | SiSi |
|---|---|---|---|---|---|---|---|
| CC | 0 | −2 | −26 | −32 | −35 | −50 | −53 |
| BN | 2 | 0 | −24 | −29 | −32 | −47 | −50 |
| SiC | 26 | 24 | 0 | −5 | −7 | −19 | −21 |
| AlN | 32 | 29 | 5 | 0 | −2 | −14 | −16 |
| GaN | 35 | 32 | 7 | 2 | 0 | −11 | −13 |
| InN | 50 | 47 | 19 | 14 | 11 | 0 | −2 |
| SiSi | 53 | 50 | 21 | 16 | 13 | 2 | 0 |

Si substrates are useful materials for the construction of the single crystal semiconductor layers of the present invention. Si can readily be produced as a single crystal wafer or substrate. This single crystal nature assists in orienting subsequently deposited semiconductor layers as substantially single crystal structures.

As shown in FIG. 1, InN 12 may be deposited on a lattice-orienting Si substrate 10. Various methods of depositing InN onto the Si substrate are contemplated, all of which are considered to be within the scope of the present invention. In one aspect, InN may be deposited on the Si substrate using MOCVD techniques. As is shown in Table 1, the lattice mismatch between SiSi and InN is approximately 2%. Such close lattice mismatching may allow InN to be deposited onto the Si substrate as a substantially single crystal. The lattice mismatch may be further improved during the deposition, however, through compositionally grading between the layers. In other words, the Si substrate can be gradually graded into InN to further reduce the level of lattice mismatching between the two layers. Such grading can be accomplished by doping the surface of the Si substrate with In atoms. Doping methods are known to those of ordinary skill in the art. MOCVD deposition can then be performed on the doped surface with silicon and gases containing indium and nitrogen. Suitable silicon sources may include, without limitation, silane, $SiH_4$, etc. Examples of indium and nitrogen sources may include, without limitation, $InH_3$ and $NH_3$, respectively. Accordingly, the grading may occur during deposition over time by decreasing the concentration of the Si source, increasing the concentration of the In source, and gradually introducing and increasing nitrogen source. Such a process provides a gradual transition from Si to InN that has minimal lattice dislocations and grain boundaries. A similar process may be performed for other base layer materials. For example, Si may be doped with Al and/or P followed by MOCVD deposition of Si, Al, and P to form a graded Si to AlP base layer.

Various methods may also be utilized to increase the epitaxial deposition between materials. In one aspect, the deposition surface, or surface receiving the deposition, may be roughened to increase the uniformity of the crystal lattice orientation of the deposited layer. For example, the surface of the Si substrate can be roughened to form pits or tips. If the tips or pits are close enough, dislocations will not be trapped within the lattice as they grow, but will meet early in growth and thus merge into a continuous lattice. As an example, in one aspect pits or tips may have an average spacing of less than about 5 microns. In another aspect, pits or tips may have an average spacing of less than about 1 micron. In yet another aspect, pits or tips may have an average spacing of less than about 0.5 microns. In a further aspect, pits or tips may have an average spacing of less than about 0.1 micron. Such roughing can be accomplished by any means known to one of ordinary skill in the art, such as, for example, sand blasting, sanding, chemical etching, ultrasound etching, electrical etching, etc. Additionally, such roughening may be utilized to improve epitaxy between any adjacent layers, such as between the Si substrate and the base layer, between the base layer and the semiconductor layer, between multiple semiconductor layers, etc.

Returning to FIG. 1, a semiconductor layer 14 can be deposited on the InN layer 12. The semiconductor layers of the present invention may comprise any material that is suitable for forming electronic devices, semiconductor devices, or the like. Most semiconductors are based on silicon, gallium, indium, and germanium. However, suitable materials for the semiconductor layer can include, without limitation, silicon, silicon carbide, gallium arsenide, gallium nitride, germanium, zinc sulfide, gallium phosphide, gallium antimonide, gallium indium arsenide phosphide, aluminum gallium arsenide, gallium nitride, boron nitride, aluminum nitride, indium arsenide, indium phosphide, indium antimonide, indium nitride, and composites thereof. In one embodiment, the semiconductor layer can comprise silicon, silicon carbide, gallium arsenide, gallium nitride, aluminum nitride, indium nitride, indium gallium nitride, aluminum gallium nitride, or composites of these materials. In some additional embodiments, non-silicon based devices can be formed such as those based on gallium arsenide, gallium nitride, germanium, boron nitride, aluminum nitride, indium-based materials, and composites thereof. In another embodiment, the semiconductor layer can comprise gallium nitride, indium gallium nitride, indium nitride, and combinations thereof. Other semiconductor materials which can be used include $Al_2O_3$, BeO, W, Mo, c-$Y_2O_3$, c-$(Y_{0.9}La_{0.1})_2O_3$, c-$Al_{23}O_{27}N_5$, c-$MgAl_2O_4$, t-$MgF_2$, graphite, and mixtures thereof. It should be understood that the semiconductor layer may include any semiconductor material known, and should not be limited to those materials described herein. Additionally, semiconductor materials may be of any structural configuration known, for example, without limitation, cubic (zincblende or sphalerite), wurtzitic, rhombohedral, graphitic, turbostratic, pyrolytic, hexagonal, amorphous, or combinations thereof.

In one aspect, the semiconductor layer can be AlN, GaN, and combinations thereof. Noting from Table 1 that the lattice mismatch between InN and either of AlN or GaN is greater than 5%, grading between the layers should be utilized in order to maintain the substantially single crystal nature of the InN layer into the semiconductor layer. The semiconductor layer may be deposited by any method known to one of ordinary skill in the art. Various known methods of vapor deposition can be utilized to deposit such layers and that allow deposition to occur in a graded manner.

In one aspect of the present invention, the semiconductor layer may be GaN. GaN semiconductor layers may be useful in constructing LEDs and other SOD devices. Gradually transitioning the InN layer into the GaN layer may occur by fixing the concentration of the N being deposited and varying the deposited concentration of Ga and of In such that a ratio of Ga:In gradually transitions from about 0:1 to about 1:0. In other words, the sources of Ga and In are varied such that as the In concentration is decreased, the Ga concentration is increased. The gradual transition functions to greatly reduce the lattice mismatch observed when depositing GaN directly on InN.

In another aspect, the semiconductor layer may be a layer of AlN. The AlN layer may be deposited onto the InN layer by any means known to one of ordinary skill in the art. In order to minimize the lattice mismatch between InN and AlN, however, in one aspect the AlN may be deposited onto the layer of InN by gradually transitioning the layer of InN into the layer of AlN. In one aspect, for example, gradually transitioning the layer of InN into the layer of AlN may include fixing the concentration of N being deposited and varying the deposited concentration of In and of Al such that a ratio of In:Al gradually transitions from about 0:1 to about 1:0. Such a gradual transition may greatly reduce the lattice mismatch observed when depositing AlN on InN directly. Surface processing may be performed between any of the deposition steps described in order to provide a smooth surface for subsequent deposition. Such processing may be accomplished by any means known, such as by chemical etching, polishing, buffing, grinding, etc.

As is shown in FIG. 1, following the deposition of the semiconductor layer 14 onto the InN layer 12, a layer of diamond 16 may be disposed onto the semiconductor layer 14. The diamond layer 16 may provide various benefits to the SOD substrate, including temperature regulation, acoustic propagation, etc. Any form of diamond layer known may be utilized in the various aspects of the present invention, including single crystal diamond, polycrystalline diamond, diamond-like carbon, amorphous diamond, etc. The diamond layer may be formed directly on the semiconductor layer, or it may be formed separately from the semiconductor layer and subsequently coupled thereto.

In those aspects wherein the diamond layer is formed directly on the semiconductor layer, such formation may occur by any means know to one of ordinary skill in the art. The most common vapor deposition techniques include CVD and PVD, although any similar method can be used if similar properties and results are obtained. In one aspect, CVD techniques such as hot filament, microwave plasma, oxyacetylene flame, rf-CVD, laser CVD (LCVD), metal-organic CVD (MOCVD), laser ablation, conformal diamond coating processes, and direct current arc techniques may be utilized. Typical CVD techniques use gas reactants to deposit the diamond or diamond-like material in a layer, or film. These gases generally include a small amount (i.e. less than about 5%) of a carbonaceous material, such as methane, diluted in hydrogen. A variety of specific CVD processes, including equipment and conditions, are well known to those skilled in the art. Additionally, many of the described techniques may be utilized in the deposition of base and/or semiconductor layers.

An optional nucleation enhancing layer can be formed on the growth surface of the semiconductor layer in order to improve the quality and deposition time of the diamond layer. Specifically, the diamond layer can be formed by depositing applicable nuclei, such as diamond nuclei, on the interface surface of the semiconductor layer and then growing the nuclei into a film or layer using a vapor deposition technique. In one aspect of the present invention, a thin nucleation enhancer layer can be coated upon the semiconductor layer to enhance the growth of the diamond layer. Diamond nuclei are then placed upon the nucleation enhancer layer, and the growth of the diamond layer proceeds via CVD as described herein.

A variety of suitable materials will be recognized by those in skilled in the art which can serve as a nucleation enhancer. In one aspect of the present invention, the nucleation enhancer may be a material selected from the group consisting of metals, metal alloys, metal compounds, carbides, carbide formers, and mixtures thereof. Examples of carbide forming materials include without limitation, tungsten (W), tantalum (Ta), titanium (Ti), zirconium (Zr), chromium (Cr), molybdenum (Mo), silicon (Si), and manganese (Mn). Additionally, examples of carbides include tungsten carbide (WC), silicon carbide (SiC), titanium carbide (TiC), zirconium carbide (ZrC), and mixtures thereof among others.

The nucleation enhancer layer, when used, is a layer which is thin enough that it does not to adversely affect the transfer of the intended configuration from the interface surface to the device surface. In one aspect, the thickness of the nucleation enhancer layer may be less than about 0.1 micrometers. In another aspect, the thickness may be less than about 10 nanometers. In yet another aspect, the thickness of the nucleation enhancer layer is less than about 5 nanometers. In a further aspect of the invention, the thickness of the nucleation enhancer layer is less than about 3 nanometers.

Various methods may be employed to increase the quality of the diamond in the nucleation surface of the diamond layer which is created by vapor deposition techniques. For example, diamond particle quality can be increased by reducing the methane flow rate, and increasing the total gas pressure during the early phase of diamond deposition. Such measures, decrease the decomposition rate of carbon, and increase the concentration of hydrogen atoms. Thus a significantly higher percentage of the carbon will be deposited in a $sp^3$ bonding configuration, and the quality of the diamond nuclei formed is increased. Additionally, the nucleation rate of diamond particles deposited on the growth surface of the semiconductor layer or the nucleation enhancer layer may be increased in order to reduce the amount of interstitial space between diamond particles. Examples of ways to increase nucleation rates include, but are not limited to: applying a negative bias in an appropriate amount, often about 100 volts, to the growth surface; polishing the growth surface with a fine diamond paste or powder, which may partially remain on the growth surface; and controlling the composition of the growth surface such as by ion implantation of C, Si, Cr, Mn, Ti, V, Zr, W, Mo, Ta, and the like by PVD or PECVD. PVD processes are typically at lower temperatures than CVD processes and in some cases can be below about 200° C. such as about 150° C. Other methods of increasing diamond nucleation will be readily apparent to those skilled in the art.

In one aspect of the present invention, the diamond layer may be a conformal diamond layer. Conformal diamond coating processes can provide a number of advantages over conventional diamond film processes. Conformal diamond coating can be performed on a wide variety of substrates, including non-planar substrates. A growth surface can be pretreated under diamond growth conditions in the absence of a bias to form a carbon film. The diamond growth conditions can be conditions which are conventional CVD deposition conditions for diamond without an applied bias. As a result, a thin carbon film can be formed which is typically less than about 100 angstroms. The pretreatment step can be performed at almost any growth temperature such as from about 200° C. to about 900° C., although lower temperatures below about 500° C. may be preferred. Without being bound to any particular theory, the thin carbon film appears to form within a short time, e.g., less than one hour, and is a hydrogen terminated amorphous carbon. Further, the diamond film typically begins growth substantially over the entire substrate. In addition, a continuous film, e.g. substantially no grain boundaries, can develop within about 80 nm of growth.

As has been described, in one more detailed aspect of the present invention, the growth surface can be etched with micro-scratches to enhance nucleation. One method of introducing such micro-scratches is to immerse the semiconductor layer in an acetone bath containing suspended micron-size diamond particles. Ultrasonic energy can then be applied to the semiconductor layer and/or the fluid. Upon removal from the ultrasonic bath, a portion of the micron-sized diamonds remains on the surface as diamond growth seeds.

In those aspect wherein the diamond layer is formed separately from the semiconductor layer, such formation may also occur by any means know. In addition to various chemical and physical deposition techniques (e.g. CVD, MOCVD, PVD, etc.), various high-pressure high-temperature processes may be utilized to form the diamond layer. One example of a high quality diamond layer formed under such conditions may be found in U.S. patent application Ser. No. 11/200,647, filed on Aug. 9, 2005, which is incorporated herein by reference in its entirety.

Diamond layers formed separately from the semiconductor layer may be coupled thereto by any means known. In one aspect, for example, the diamond layer may be coupled to the semiconductor layer using an adhesive or bonding material. Though various methods of bonding the layers of the present invention together are contemplated, such bonding can occur by using an ultra thin layer of bonding material. Prior to bonding, corresponding adjoining surfaces may be polished or prepared to have a comparable surface roughness. The surface roughness will depend on the intended final device. Subsequently, an ultra thin layer of bonding material may be produced by forming a layer of bonding material on either of the surfaces to be joined and then pressing the two surfaces together in order to reduce the bonding layer thickness to less than about 1 micron and preferably less than about 10 nanometers (i.e. only a few molecules thick). The bonding material may comprise an organic binder such as an epoxy or may be a reactive metal such as Ti, Si, Zr, Cr, Mo, W, Mn, or mixtures thereof. In the case of a reactive metal, the metal may be sputtered on either surface and then pressed against the other surface under heat and vacuum conditions. At these ultra thin thicknesses, the bonding material is more stable at higher temperatures. For example, typical epoxy binders will fail at temperatures above about 200° C.; however at ultra thin thicknesses the epoxy remains strong at higher temperatures.

In another aspect the diamond layer may be brazed to the semiconductor layer. For aspects including brazing, care must be taken to utilize brazes that have lower melting temperatures to avoid damage to the semiconductor and diamond layers. Additionally, the braze should be selected such that metals contained therein will not affect the utility of the semiconductor layer or the resulting SOD device. A variety of brazing alloys may be suitable for use in the present invention. In one aspect, a braze alloy may include a carbide former such as Ti, Cr, Si, Zr, Mn, and mixtures thereof. Several exemplary braze alloys include those of Ag—Cu—Ti, Ag—Cu—Sn—Ti, Ni—Cr—B—Si, Ni—Cu—Zr—Ti, Cu—Mn, and mixtures thereof. The brazing alloy may be supplied in any known form such as a powder or as a thin foil. Typical brazing temperatures are below about 1000° C. such as about 900° C., though many braze materials may be selected having lower melting temperatures.

The diamond layers of the present invention may comprise any diamond-containing material known to one skilled in the art. Generally the diamond layer can be of any conceivable thickness, depending on the intended function of the diamond layer and the nature of the semiconductor device. More particularly, in one aspect the diamond layer may have a thickness from about 10 nm to about 2000 μm. In another aspect, the diamond layer may have a thickness of from about 10 nm to about 500 μm. Further, diamond layer thicknesses of less than about 10 μm can be suitable for some applications. In yet another aspect, the diamond layer may have a thickness of from about 10 nm to about 100 μm. In a further aspect, the diamond layer may have a thickness of from about 10 nm to about 30μm.

Returning to FIG. 1, the Si substrate 10 and the InN layer 12 may be removed to expose the semiconductor layer 14. The Si substrate 10 and the InN layer 12 may be removed by any means known to one of ordinary skill in the art, including, but not limited to, physical means such as grinding, sawing, buffing, polishing, sand blasting, etc., and chemical means such as etching, etc. Additionally, either prior to or following the removal of the layers, a support substrate 18 may be coupled to the diamond layer 16 to provide added support and/or added functionality to the SOD device. The support substrate 18 may be of any material known, including Si, W, Ti, Mo, SiC, SiGe, SiB, SiP, epoxies, polyimides, acrylics, etc. The support substrate 18 may be coupled to the diamond layer 16 using an adhesive, a braze, or any other attachment means. In one aspect, the support substrate may be applied as a molten alloy. For example, in one aspect a molten alloy of SiGe may be applied to the diamond layer and allowed to cool to form the support substrate. In another aspect, the molten material forming the support substrate may include boron doped Si to form a p-type semiconductor. In yet another aspect, the molten material forming the support substrate may include phosporous doped Si to form a n-type semiconductor.

Figure 2:
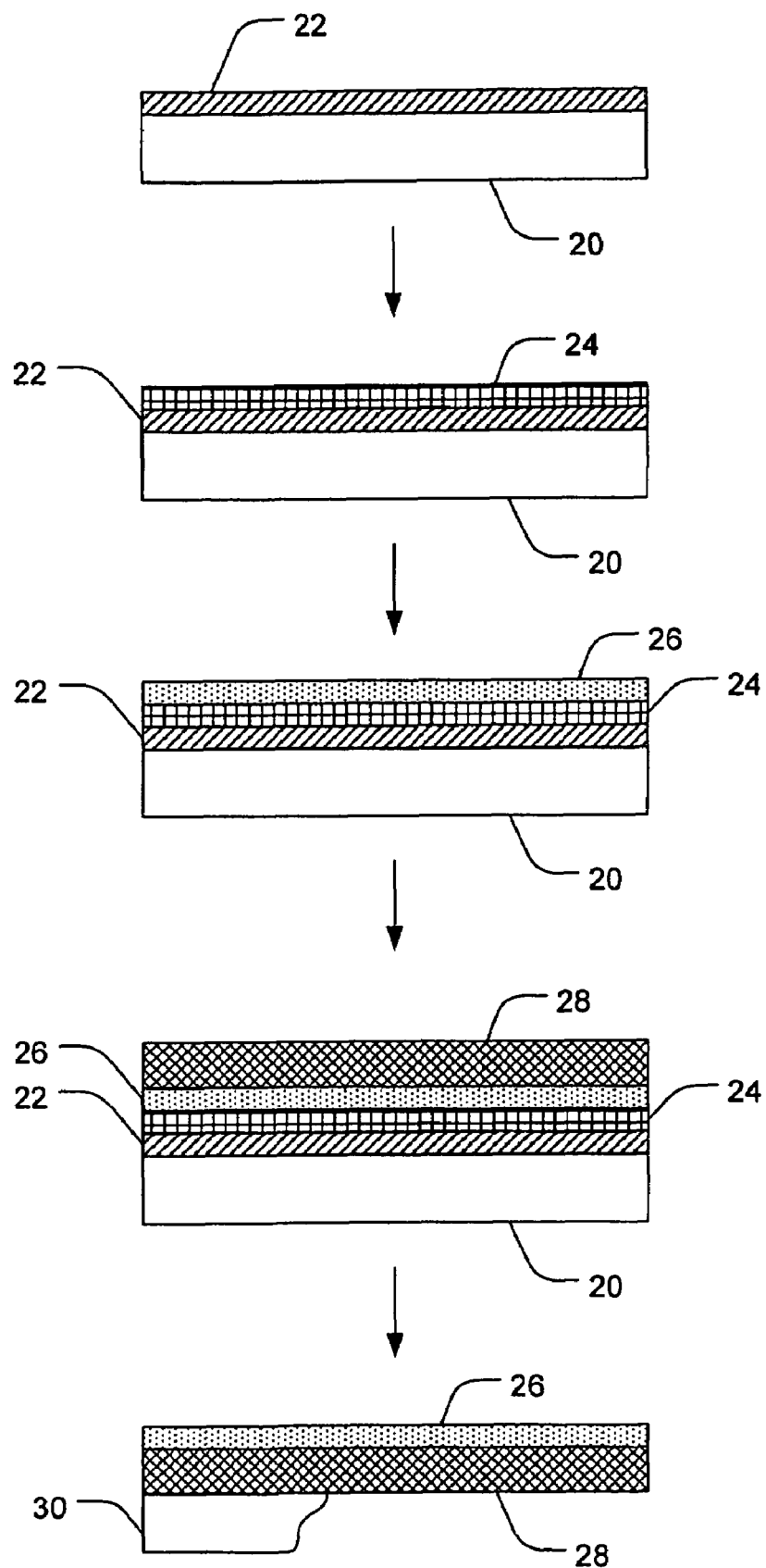
FIG. 2 is a sequential depiction of a method of making an SOD device in accordance with one embodiment of the present invention.

As shown in FIG. 2, another aspect of the present invention may include depositing an InN layer 22 onto a lattice-orienting Si substrate 20. The InN layer 22 may be deposited onto the Si substrate 20 in a manner similar to that described in FIG. 1. A layer of GaN 24 may then be deposited on the InN layer 22, also as described in FIG. 1. A layer of AlN 26 may then be deposited onto the GaN layer 24. Depositing the AlN layer 26 onto the GaN 24 layer may include gradually transitioning the layer of GaN into the layer of AlN. Gradually transitioning the GaN layer 24 into the AlN layer 26 may include fixing the concentration of N being deposited and varying the deposited concentration of Ga and of Al such that a ratio of Ga:Al gradually transitions from about 0:1 to about 1:0. Constructing the various layers according to this aspect in such a way allows the single crystal nature of the Si substrate 20 to be maintained throughout the subsequently deposited layers, and thus a single crystal AlN layer may be formed thereon. A diamond layer 28 may then be disposed onto the AlN layer 26 as described in FIG. 1. The Si substrate 20, InN layer 22, and GaN layer 24 may be removed to expose the single crystal AlN layer 26. As has been described, surface processing can be performed to smooth a surface prior to deposition of any of the recited layers. Additionally, either prior to or following the removal of the layers, a support substrate 30 may be coupled to the diamond layer 28 to provide added support and/or added functionality to the SOD device. The support substrate 30 may be of any material known, including Si, W, Ti, Mo, SiC, SiGe, SiB, SiP, epoxies, polyimides, acrylics, etc. . The support substrate 30 may be coupled to the diamond layer 28 using an adhesive, a braze, or any other attachment means.

SOD device may be utilized to construct a variety of devices, including LEDs, SAW filters, semiconductor substrates, etc. In one aspect, SOD devices according to various aspects of the present invention may be used to create numerous types of LED devices. Two of the structural types that can be formed by tetrahedral bonding are cubic and hexagonal. Tetrahedral semiconductors tend to be based on cubic structures (Si, SiC, GaAl, GaP . . . etc). Current AlN, GaN, InN for red, blue, green and white LEDs, however, are based on wurtzite structures. One problem associated with wurtzite structures concerns the fact that a hexagonal system may not be isotropic in electrical and optical transmissions. In other words, all wurtzitic LEDs are piezoelectric. LED crystals are often deposited epitaxially, which creates internal stress within the crystal. This internal stress creates an electric field due to the piezoelectric nature of the wurtzitic structure. This internal electrical field will interfere with the externally applied field for lighting the LED. Additionally, light generated in the LED will be refracted due to these internal stresses, and thus will not be transmitted uniformly. Hexagonal structures are particularly problematic in the manufacture of laser diodes. In addition to the problems described above, hexagonal crystals lack a natural cleavage plane for mirror reflection of photons. Current techniques of making laser diodes utilize dry etching techniques to make parallel reflection planes. Dry etching cannot duplicate a natural crystallographic plane, and thus it inevitably leaves pits and curvatures. In contrast, cubic crystals can be cleaved naturally to form reflection mirrors of high quality, without resorting to expensive etching procedures.

Because the energy difference between wurtzite and cubic structures is very small (for GaN it is about 0.11 eV), it can be overcome with a kinetic approach by using a (100) face of the Si substrate. As such, atoms normally deposited as wurtzite deposit as cubic because of the anchoring sites on the (100) face. Thus by using (100) Si substrate, the InN layer, the GaN layer, and the AlN layer can be deposited as a cubic (sphalerite) structure. The resulting cubic nitride LED may exhibit enhanced performance in quantum photon efficiency (i.e. the percentage of power that becomes light) and light extracting efficiency (percentage of light that is emitted), two critical measures for LED performance. Cubic nitride LED materials may be particularly useful for laser diode LEDs due to the presence of (100) cleavage planes for mirror reflectors required for resonance.

In another aspect, BN can be deposited on the semiconductor layer to form a UV LED. Numerous types of LEDs may be fabricated according to aspects of the present invention, all of which are considered to be within the present scope.

Various structural configurations of LEDs are also contemplated. For example, two main types of LEDs are commonly used today. One type includes the deposition of GaN and other semiconductors on an insulating sapphire so that both positive and negative electrodes lie on the same side of the LED. As a result, current must bend around between the two electrodes so the entire volume of the doped semiconductor cannot be fully utilized. The other type provides an LED having nitride semiconductors on semiconducting SiC substrate. The SiC can be used as the electrode in this case, so the LED is symmetrical, allowing electrical current to pass through essentially all of the semiconducting material. The diamond layer according to various aspects of the present invention may be utilized according to this design to produce a more efficient LED. Though diamond has insulating properties, boron doping the diamond layer may make it semiconducting, so that it may be used as an electrode. Alternatively, the conducting metal (e.g. Cu, Ti) can be alternated with diamond and used as an electrode.

Particularly useful structures may also be constructed through further deposition of semiconductor layers. For example, in one aspect a boron nitride (BN) may be deposited onto the layer of AlN. The BN layer may be of any configuration, including, without limitation, cubic BN (cBN), wurtzitic BN (wBN), etc. The BN layer may be deposited directly onto the AlN layer or it may be compositionally graded. Compositional grading may be accomplished by fixing the concentration of the N being deposited and varying the deposited concentration of B and of Al such that a ratio of B:Al gradually transitions from about 0:1 to about 1:0. In other words, the sources of B and Al are varied such that as the Al concentration is decreased, the B concentration is increased. This gradual transition functions to greatly reduce the lattice mismatch observed when depositing BN directly on AlN.

The high quality BN layer formed is an ideal seed material for depositing single crystal CVD diamond. In one aspect, a fast growing nitrogen doped single crystal diamond may be deposited under higher methane conditions, higher pressure, and higher temperature as compared to conventional CVD processes. A description of such a quick growth process can be found in U.S. Pat. No. 6,858,078, filed on Nov. 6, 2002, which is incorporated herein by reference. Diamond layers may also be grown on the BN seed substrate under high-temperature high-pressure conditions. A description of such a process is described in U.S. patent application Ser. No. 10/757,715, filed on Jan. 13, 2004, U.S. patent application Ser. No. 10/775,042, filed on Feb. 6, 2004, and U.S. patent application Ser. No. 11/211,139, filed on Aug. 24, 2005, all of which are incorporated herein by reference.

What is claimed is:

1. A method of making a semiconductor-on-diamond substrate, comprising:

depositing a base layer onto a lattice-orienting Si substrate such that the base layer lattice is substantially oriented by the Si substrate, said base layer including a member selected from the group consisting of AlP, BAs, GaN, InN, and combinations thereof;

depositing a semiconductor layer onto the base layer such that the semiconductor layer lattice is substantially oriented with respect to the base layer lattice;

disposing a layer of diamond onto the semiconductor layer;

removing the lattice-orienting Si substrate and the base layer from the semiconductor layers, wherein the base layer is deposited onto a (100) face of the lattice-orienting Si substrate such that the base layer is deposited as a cubic base layer and the semiconductor layer is deposited onto a (100) face of the cubic base layer such that the semiconductor layer is deposited as a cubic semiconductor layer.

2. The method of claim 1, wherein the Si substrate is of a single crystal orientation.

3. The method of claim 1, wherein the semiconductor layer is a layer of GaN.

4. The method of claim 3, wherein the base layer is InN.

5. The method of claim 4, wherein depositing the layer of GaN onto the layer of InN further comprises gradually transitioning the layer of InN into the layer of GaN.

6. The method of claim 5, wherein gradually transitioning the layer of InN into the layer of GaN further comprises:
   fixing the concentration of N being deposited; and
   varying the deposited concentration of Ga and of In such that a ratio of Ga:In gradually transitions from about 0:1 to about 1:0.

7. The method of claim 1, wherein the semiconductor layer is a layer of AlN.

8. The method of claim 7, wherein the base layer is InN.

9. The method of claim 8, wherein depositing the layer of AlN onto the layer of InN further comprises gradually transitioning the layer of InN into the layer of MN.

10. The method of claim 9, wherein gradually transitioning the layer of InN into the layer of MN further comprises:
    fixing the concentration of N being deposited; and
    varying the deposited concentration of In and of Al such that a ratio of In:Al gradually transitions from about 1:0 to about 0:1.

11. The method of claim 1, wherein disposing the layer of diamond further includes bonding the layer of diamond to the semiconductor layer.

12. The method of claim 1, further comprising coupling the diamond layer to a support substrate.

13. The method of claim 1, wherein the semiconductor layer is of a single crystal orientation.

14. A method of making a semiconductor-on-diamond substrate, comprising:
    depositing a base layer onto a lattice-orienting Si substrate such that the base layer lattice is substantially oriented by the Si substrate, said base layer including a member selected from the group consisting of AlP, BAs, GaN, InN, and combinations thereof;
    depositing a semiconductor layer onto the base layer such that the semiconductor layer lattice is substantially oriented with respect to the base layer lattice;
    disposing a layer of diamond onto the semiconductor layer;
    removing the lattice-orienting Si substrate and the base layer from the semiconductor layer,
    wherein the base layer is InN, and depositing the semiconductor layer further comprises:
    depositing a layer of GaN onto the layer of InN such that the GaN layer lattice is substantially oriented with respect to the InN layer lattice; and
    depositing a layer of AlN onto the layer of GaN such that the AlN layer lattice is substantially oriented with respect to the GaN layer lattice.

15. The method of claim 14, wherein depositing the layer of GaN onto the layer of InN further comprises gradually transitioning the layer of InN into the layer of GaN.

16. The method of claim 14, wherein depositing the layer of AlN onto the layer of GaN further comprises gradually transitioning the layer of GaN into the layer of AlN.

17. The method of claim 16, wherein gradually transitioning the layer of GaN into the layer of AlN further comprises:
    fixing the concentration of N being deposited; and
    varying the deposited concentration of Ga and of Al such that a ratio of Ga:Al gradually transitions from about 0:1 to about 1:0.

18. The method of claim 14, further comprising removing the GaN layer from the AlN layer.

19. A method of making a semiconductor-on-diamond substrate, comprising:
    depositing a base layer onto a lattice-orienting Si substrate such that the base layer lattice is substantially oriented by the Si substrate, said base layer including a member selected from the group consisting of AlP, BAs, GaN, InN, and combinations thereof;
    depositing a semiconductor layer onto the base layer such that the semiconductor layer lattice is substantially oriented with respect to the base layer lattice;
    disposing a layer of diamond onto the semiconductor layer;
    removing the lattice-orienting Si substrate and the base layer from the semiconductor layer,
    wherein disposing the layer of diamond further includes forming the layer of diamond on the semiconductor layer, and further comprising depositing a conformal carbon coating onto the semiconductor layer prior to forming the layer of diamond.

20. A method of making a semiconductor-on-diamond substrate, comprising:
    depositing a base layer onto a lattice-orienting Si substrate such that the base layer lattice is substantially oriented by the Si substrate, said base layer including a member selected from the group consisting of AlP, BAs, GaN, InN, and combinations thereof;
    depositing a semiconductor layer onto the base layer such that the semiconductor layer lattice is substantially oriented with respect to the base layer lattice;
    disposing a layer of diamond onto the semiconductor layer;
    removing the lattice-orienting Si substrate and the base layer from the semiconductor Layer,
    wherein depositing the base layer further comprises:
    depositing a layer of SiC onto the lattice-orienting Si substrate such that the SiC layer lattice is substantially oriented by the Si substrate; and
    depositing the base layer onto SiC layer such that the base layer lattice is substantially oriented with respect to the SiC layer lattice.

* * * * *